United States Patent
Iwano et al.

(10) Patent No.: US 10,529,583 B2
(45) Date of Patent: Jan. 7, 2020

(54) ETCHING METHOD

(71) Applicant: Tokyo Electron Limited, Tokyo (JP)

(72) Inventors: Mitsuhiro Iwano, Miyagi (JP); Masanori Hosoya, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/182,774

(22) Filed: Nov. 7, 2018

(65) Prior Publication Data

US 2019/0139780 A1 May 9, 2019

(30) Foreign Application Priority Data

Nov. 8, 2017 (JP) .................................. 2017-215590

(51) Int. Cl.
| | |
|---|---|
| *H01L 21/311* | (2006.01) |
| *H01L 21/768* | (2006.01) |
| *H01L 21/67* | (2006.01) |
| *H01L 21/683* | (2006.01) |
| *H01L 29/66* | (2006.01) |

(52) U.S. Cl.
CPC .. *H01L 21/31116* (2013.01); *H01L 21/31144* (2013.01); *H01L 21/67069* (2013.01); *H01L 21/6833* (2013.01); *H01L 21/76805* (2013.01); *H01L 21/76897* (2013.01); *H01L 29/66795* (2013.01)

(58) Field of Classification Search
None
See application file for complete search history.

(56) References Cited

U.S. PATENT DOCUMENTS

| | | | | |
|---|---|---|---|---|
| 9,165,783 | B2 * | 10/2015 | Nemani | H01L 21/3105 |
| 9,443,701 | B2 * | 9/2016 | Watanabe | H01J 37/32532 |
| 10,026,621 | B2 * | 7/2018 | Ko | H01L 21/0223 |
| 10,062,575 | B2 * | 8/2018 | Choi | H01L 21/3065 |
| 10,109,495 | B2 * | 10/2018 | Watanabe | H01L 21/31144 |
| 2015/0235860 | A1 * | 8/2015 | Tomura | H01L 21/76897 438/694 |
| 2015/0325415 | A1 * | 11/2015 | Watanabe | H01J 37/32532 216/67 |
| 2018/0005850 | A1 * | 1/2018 | Citla | H01L 21/67069 |

FOREIGN PATENT DOCUMENTS

JP    2016-136606 A    7/2016

* cited by examiner

*Primary Examiner* — Allan W. Olsen
(74) *Attorney, Agent, or Firm* — Pearne & Gordon LLP

(57) ABSTRACT

An etching method is provided. A processing target object includes a first region made of silicon oxide and a second region made of silicon nitride. The second region is extended to provide a recess and has a bottom region extended on a bottom of the recess. The first region is configured to cover the second region. In the etching method, a deposit of fluorocarbon is formed on the processing target object, and the first region is etched by irradiating ions of atoms of a rare gas toward the processing target object. Then, on the bottom region, a modified region is formed by supplying hydrogen ions. Subsequently, the deposit of fluorocarbon is formed on the processing target object, and the modified region is etched by irradiating ions of atoms of the rare gas toward the processing target object.

14 Claims, 11 Drawing Sheets

//ETCHING METHOD

CROSS-REFERENCE TO RELATED APPLICATION

This application claims the benefit of Japanese Patent Application No. 2017-215590 filed on Nov. 8, 2017, the entire disclosure of which is incorporated herein by reference.

TECHNICAL FIELD

The various aspects and embodiments described herein pertain generally to an etching method.

BACKGROUND

In the manufacture of an electronic device, etching is performed to remove a certain region of a processing target object selectively. For example, a first region made of silicon oxide is selectively etched with respect to a second region which is formed of silicon nitride. A method of etching the first region selectively with respect to the second region is described in Patent Document 1.

On the processing target object to which the method described in Patent Document 1 is applied, the second region is extended on an underlying region to provide a recess. The second region has a bottom region. The bottom region is extended at a bottom of the recess. The first region is configured to cover the second region. In the method disclosed in Patent Document 1, plasma of a processing gas containing fluorocarbon is generated, and a deposit containing the fluorocarbon is formed on the processing target object. Then, plasma of a rare gas is generated, and ions of rare gas atoms are supplied to the processing target object. The deposit protects the second region. Meanwhile, the fluorocarbon in the deposit etches the first region if the ions of the rare gas atoms are supplied to the processing target object.

Patent Document 1: Japanese Patent Laid-open publication No. 2016-136606

SUMMARY

After the above-stated etching of the first region, the bottom region needs to be selectively etched. To etch the bottom region, there may be considered a processing of generating plasma of a hydrofluorocarbon gas and supplying a high frequency bias power to a lower electrode to attract ions from this plasma into the bottom region. The lower electrode constitutes a part of a supporting table configured to place the processing target object thereon. During the etching of the bottom region, etching of the other regions belonging to the second region needs to be suppressed. If, however, the high frequency bias power is large, a portion of the second region other than the bottom region, particularly, an upper portion of the second region is etched. If the high frequency bias power is set to be small, on the other hand, the etching of the bottom region is hampered by the deposit on the bottom region. In this regard, there has been a demand for an etching method capable of selectively etching the bottom region of the second region which is extended on the underlying region to provide the recess.

In one exemplary embodiment, there is provided an etching method of etching a processing target object. The processing target object comprises an underlying region, a first region and a second region. The second region is made of silicon nitride and comprises a first projected region, a second projected region and a bottom region. The first projected region and the second projected region are extended from the underlying region to provide a recess therebetween. The bottom region is extended on a bottom of the recess. The first region is made of silicon oxide and configured to cover the second region. The etching method comprises: (i) etching the first region; (ii) forming a modified region by selectively modifying the bottom region after the first region is etched; and (iii) etching the modified region.

The etching of the first region comprises: (a) generating plasma of a first processing gas containing a fluorocarbon gas to form a deposit of fluorocarbon on the first region; and (b) generating first plasma of a rare gas to etch the first region by supplying ions of atoms of the rare gas toward the processing target object on which the deposit is formed. In the etching of the first region, the deposit is formed on an exposed portion of the second region and the second region is protected by the deposit. A thickness of the deposit formed on a top surface of the first projected region and a top surface of the second projected region is larger than a thickness of the deposit formed on the bottom region. Further, in the forming of the modified region, plasma of a second processing gas containing hydrogen is generated, and ions of the hydrogen from the plasma of the second processing gas are supplied to the processing target object in which the first region is etched. Moreover, the etching of the modified region comprises: (c) generating plasma of a third processing gas containing a fluorocarbon gas to form a deposit of fluorocarbon on the processing target object having the modified region; and (d) generating second plasma of a rare gas to etch the modified region by supplying ions of atoms of the rare gas toward the processing target object which has the modified region and on which the deposit is formed.

During the etching of the first region, the deposit is formed as the plasma of the first processing gas is generated. Accordingly, after the etching of the first region, the thickness of the deposit formed on the top surface of the first projected region and the top surface of second projected region becomes larger than the thickness of the deposit formed on the bottom region. Since the deposit is formed to have this thickness distribution, if the hydrogen ions are irradiated toward the processing target object, the hydrogen ions reach the bottom region to be supplied thereinto, whereas the hydrogen ions do not reach the upper portion of the first projected region and the upper portion of the second projected region. As a result, at least a part of the bottom region is modified, so that the modified region is formed. Thereafter, as the formation of the deposit of the fluorocarbon and the supply of the ions of the rare gas atoms are performed, the modified region is selectively etched. Thus, in the method according to the present exemplary embodiment, the bottom region is selectively etched.

The second processing gas may further contain a nitrogen gas.

The forming of the modified region and the etching of the modified region may be repeated alternately.

The etching of the first region, the forming of the modified region and the etching of the modified region are performed in a plasma processing apparatus. The plasma processing apparatus comprises a chamber main body, a supporting table, a first high frequency power supply, a second high frequency power supply and an electromagnet. The chamber main body is configured to provide an internal space therein. The supporting table includes a lower electrode, and is configured to provide a placing region on which the processing target object is placed. The supporting table is provided within the internal space. A center of the placing region is positioned on a central axis of the chamber main body. The first high frequency power supply is configured to generate a first high frequency power for plasma generation. The second high frequency power supply is configured to generate a second high frequency power. The second high frequency power has a frequency lower than a frequency of the first high frequency power. The second high frequency power supply is electrically connected to the lower electrode. The electromagnet is configured to generate a magnetic field within the internal space. At least when the plasma of the second processing gas is being generated, the electromagnet forms within the internal space a distribution of a magnetic field in which a horizontal component at an edge side of the processing target object is larger than a horizontal component on a center of the processing target object in which the first region is etched. In the internal space, there may be formed a non-uniform electric field intensity distribution in which an electric field intensity is high at a center side of the processing target object but is low at an edge side of the processing target object. Under the non-uniform electric field intensity distribution, a plasma density is high in the vicinity of the central axis and is low at a place far from the central axis. That is, there is formed a plasma density distribution which is non-uniform in the radial direction with respect to the central axis. If this magnetic field having the above-described horizontal component is formed, the non-uniformity of the plasma density distribution is reduced even if the non-uniform electric field intensity distribution is formed. As a result, the non-uniformity in the etching rate of the bottom region within the surface is reduced.

As stated above, it is possible to selectively etch the bottom region of the silicon nitride region which is extended on the underlying region to provide the recess.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
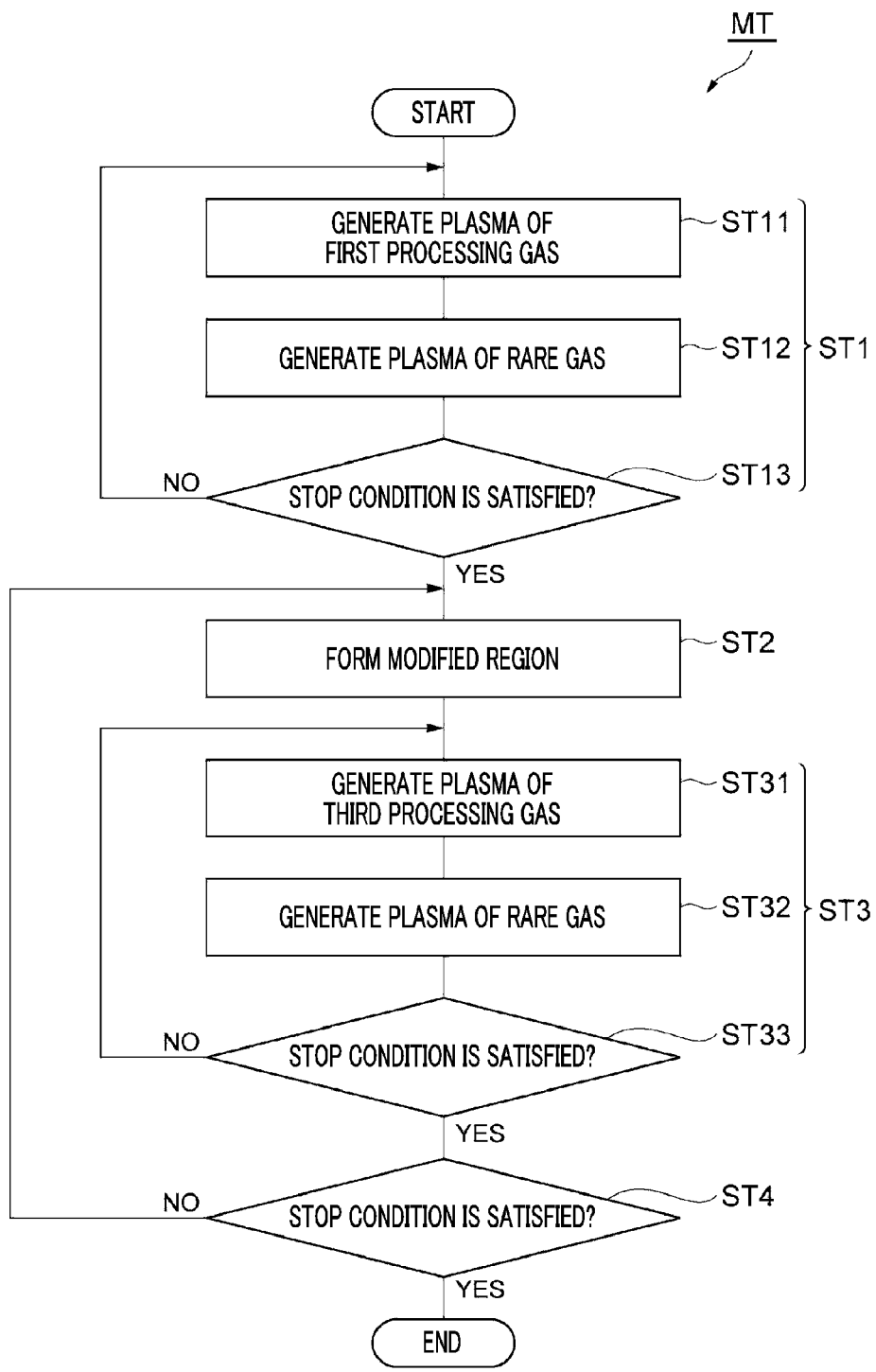
FIG. 1 is a flowchart illustrating an etching method according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, various exemplary embodiments will be described in detail with reference to the accompanying drawings. In the various drawings, same or corresponding parts will be assigned same reference numerals.

FIG. 1 is a flowchart showing an etching method according to an exemplary embodiment. The etching method (hereinafter, simply referred to as "method MT") shown in FIG. 1 is performed to etch a first region of a processing target object selectively with respect to a second region thereof and, then, to etch a bottom region of the second region selectively with respect to the other regions belonging to the second region.

Figure 2:
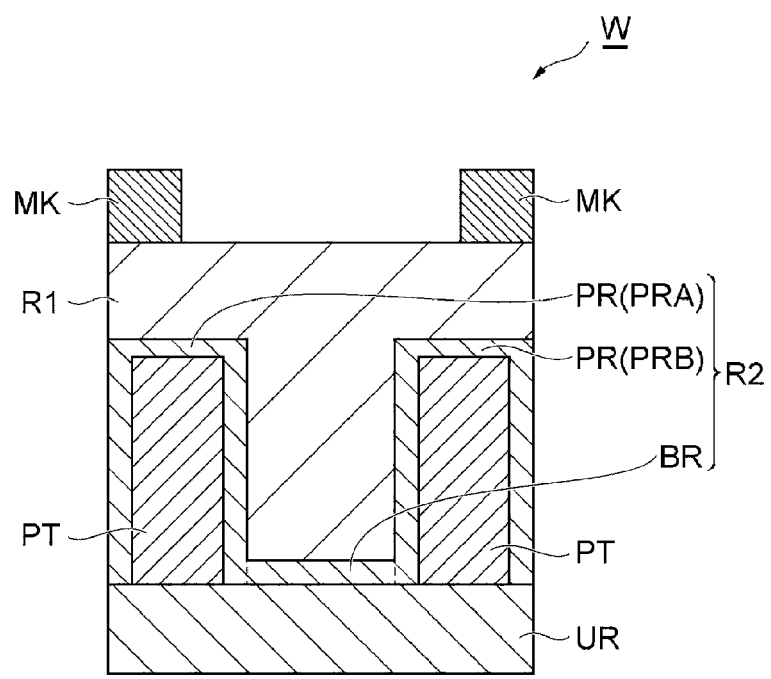
FIG. 2 is a partially enlarged cross sectional view of an example processing target object to which the etching method of FIG. 1 is applicable.

FIG. 2 is a partially enlarged cross sectional view of an example processing target object to which the etching method shown in FIG. 1 is applicable. A processing target object W shown in FIG. 2 includes an underlying region UR, a first region R1 and a second region R2. As an example, the processing target object W is a product produced in the course of manufacturing a fin-type field effect transistor.

The underlying region UR is made of, by way of example, polycrystalline silicon. As an example, the underlying region UR is a fin region and has a substantially rectangular parallelepiped shape. The processing target object W has a plurality of protrusions PT. These protrusions PT are provided on the underlying region UR and arranged substantially in parallel with each other. As an example, each of the protrusions PT is a gate region.

The second region R2 is made of silicon nitride. The second region R2 is configured to cover the protrusions PT and the underlying region UR. The second region R2 has a plurality of projected regions PR. The respective projected regions PR are extended to cover the protrusions PT and projected from the underlying region UR. That is, each of the projected regions PR is extended along a side surface and a top surface of the corresponding protrusion PT. Of two adjacent projected regions PR, one is called a first projected region PRA and the other is called a second projected region PRB. A recess is provided between the first projected region PRA and the second projected region PRB. The second region R2 is further provided with a bottom region BR. The bottom region BR is extended at a bottom of the recess. That is, the bottom region BR is extended between the first projected region PRA and the second projected region PRB and, also, on the underlying region UR.

The first region R1 is made of silicon oxide. The first region R1 is provided within the aforementioned recess provided by the second region R2. Further, the first region R1 is configured to cover the second region R2. A mask MK is provided on the first region R1. The mask MK is patterned to provide an opening above the recess provided by the second region R2. A width of the opening of the mask MK is larger than a width of the recess provided by the second region R2. The mask MK is made of an organic film. The mask MK may be produced by a photolithography technique.

Figure 3:
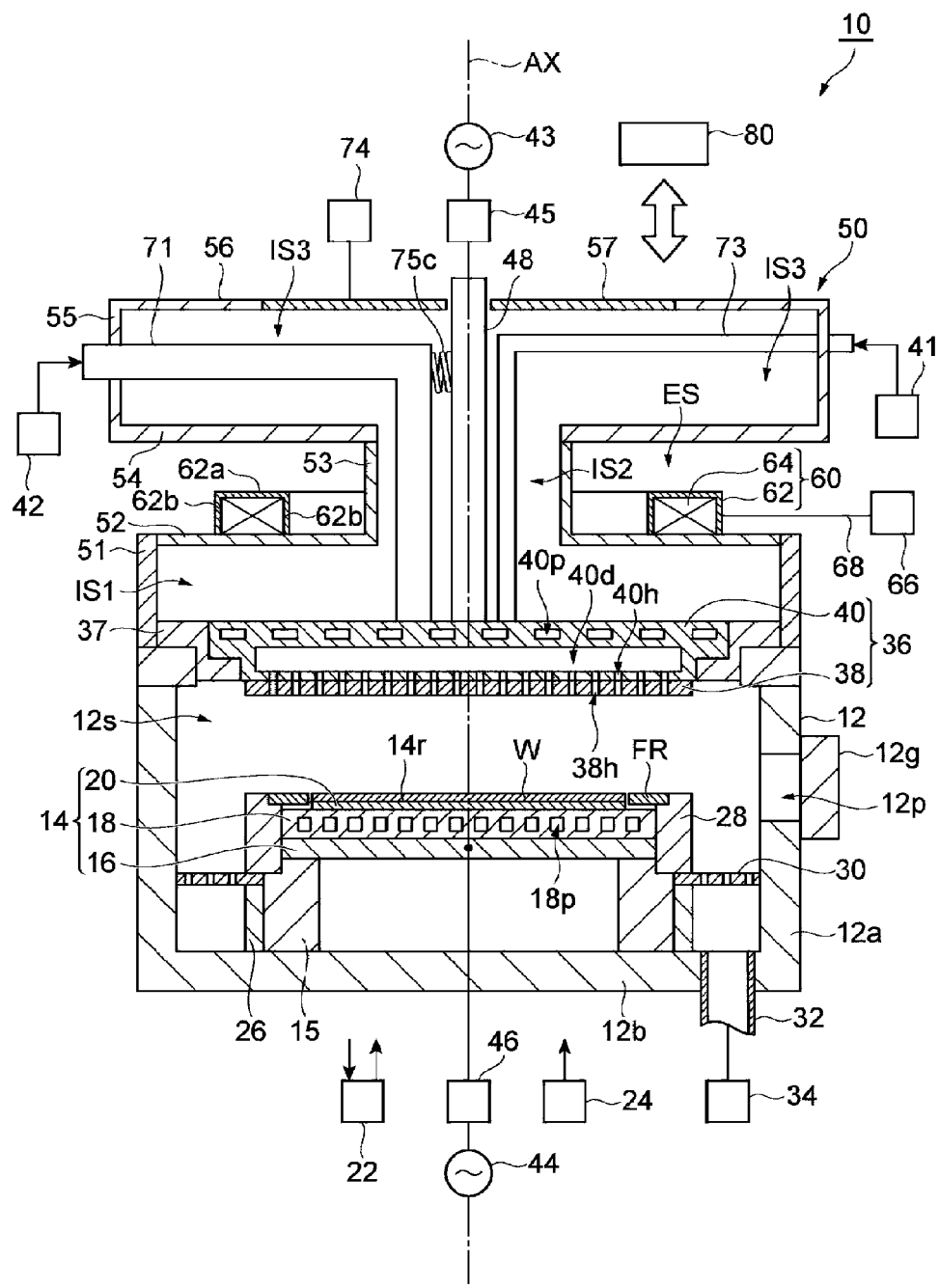
FIG. 3 is a diagram schematically illustrating a plasma processing apparatus according to the exemplary embodiment which can be used in performing the etching method of FIG. 1.

Now, the method MT will be explained for an example where the method MT is performed on the processing target object W shown in FIG. 2. In the method MT, a plasma processing apparatus is used. FIG. 3 is a diagram schematically illustrating a plasma processing apparatus according to the exemplary embodiment which can be used in performing the etching method shown in FIG. 1. FIG. 3 provides a longitudinal cross sectional view of a plasma processing apparatus 10 according to the exemplary embodiment.

The plasma processing apparatus 10 shown in FIG. 3 is equipped with a chamber main body 12. The chamber main body 12 has a cylindrical shape and includes a sidewall 12a and a bottom portion 12b. The chamber main body 12 provides an internal space 12s therein. A central axis AX shown in FIG. 3 is a central axis of the chamber main body 12 and the internal space 12s. The chamber main body 12 is made of a metal such as, but not limited to, aluminum. A film having plasma resistance is formed on an inner wall surface of the chamber main body 12. This film may be formed by an alumite film or a film made of ceramic such as yttrium oxide. The chamber main body 12 is grounded.

A passage 12p is formed at the sidewall 12a. The processing target object W passes through the passage 12p when it is transferred between the internal space 12s and an outside of the chamber main body 12. The processing target object W may have a disk shape, like a wafer. The passage 12p is configured to be opened or closed by a gate valve 12g. The gate valve 12g is provided along the sidewall 12a.

A supporting table 14 is provided within the internal space 12s. The supporting table 14 is supported by a supporting body 15. The supporting body 15 has a cylindrical shape and is extended upwards from the bottom portion 12b of the chamber main body 12. The supporting body 15 has insulation property and is made of, by way of non-limiting example, ceramic.

The supporting table 14 is configured to support the processing target object W. The supporting table 14 shares the central axis AX with the chamber main body 12. The supporting table 14 provides a placing region 14r. A center of this placing region 14r lies on the central axis AX. The processing target object W is placed on the placing region 14r such that a center of the processing target object W is located on the central axis AX.

The supporting table 14 includes an electrode plate 16, a lower electrode 18 and an electrostatic chuck 20. The electrode plate 16 has a substantially disk shape. The electrode plate 16 has conductivity. The electrode plate 16 is formed of a metal such as, but not limited to, aluminum. The lower electrode 18 has a disk shape. The lower electrode 18 has conductivity. The lower electrode 18 is made of a metal such as, but not limited to, aluminum. The lower electrode 18 is mounted on the electrode plate 16. The lower electrode 18 is electrically connected with the electrode plate 16.

A path 18p is formed within the lower electrode 18. The path 18p is extended in, for example, a spiral shape within the lower electrode 18. A heat exchange medium (for example, a coolant) is supplied into the path 18p from a circulating device 22 (for example, a chiller unit) configured to circulate the heat exchange medium. The circulating device 22 is provided at the outside of the chamber main body 12. The heat exchange medium supplied into the path 18p is returned back into the circulating device 22. A temperature of the processing target object W placed on the supporting table 14 is controlled by heat exchange between the heat exchange medium and the lower electrode 18.

The electrostatic chuck 20 is provided on the lower electrode 18. The electrostatic chuck 20 has a substantially disk shape. The electrostatic chuck 20 has a film-shaped electrode within a main body made of ceramic. The electrode of the electrostatic chuck 20 is connected to a DC power supply 24 via a switch. The electrostatic chuck 20 provides the aforementioned placing region 14r. If a DC voltage from the DC power supply 24 is applied to the electrode of the electrostatic chuck 20 in a state that the processing target object W is placed on the electrostatic chuck 20 (on the placing region 14r), an electrostatic attracting force is generated between the processing target object W and the electrostatic chuck 20. The processing target object W is attracted to and held by the electrostatic chuck 20 through the generated electrostatic attracting force. The plasma processing apparatus 10 may be further provided with a heat transfer gas supply line through which a heat transfer gas (for example, a He gas) is supplied into a gap between the electrostatic chuck 20 and a bottom surface of the processing target object W.

One or more heaters (for example, one or more resistance heating elements) may be provided within the electrostatic chuck 20. As a power is supplied to the one or more heaters from a heater controller, the one or more heaters generate heat, so that a temperature of the electrostatic chuck 20 and, ultimately, the temperature of the processing target object W is adjusted.

In the internal space 12s of the chamber main body 12, a focus ring FR is disposed to surround the electrostatic chuck 20 and an edge of the processing target object W. The focus ring FR is a ring-shaped plate and made of a silicon-containing material such as silicon or quartz. The focus ring FR is provided to achieve plasma processing uniformity.

A cylindrical conductor 26 is provided around the supporting body 15. The conductor 26 is grounded. A cylindrical insulator 28 is provided above the conductor 26 to surround the supporting table 14. The insulator 28 is made of ceramic such as quartz. An exhaust path is formed between the supporting table 14 and the sidewall 12a of the chamber main body 12. A baffle plate 30 is provided in the exhaust path. The baffle plate 30 is a ring-shaped plate. The baffle plate 30 is provided with a multiple number of holes passing through the baffle plate 30 in a plate thickness direction. The baffle plate 30 is prepared by forming a plasma resistant film such as yttrium oxide on a surface of a base member made of a metal such as aluminum.

Under the baffle plate 30, an exhaust line 32 is connected to the bottom portion 12b of the chamber main body 12. The exhaust line 32 is configured to communicate with the exhaust path. The exhaust line 32 is connected to an exhaust device 34. The exhaust device 34 includes an automatic pressure control valve and a decompression pump such as a turbo molecular pump. As the exhaust device 34 is operated, a pressure of the internal space 12s is set to a preset pressure.

An upper electrode 36 is provided above the supporting table 14. A part of the internal space 12s is provided between the upper electrode 36 and the supporting table 14. The upper electrode 36 is configured to close a top opening of the chamber main body 12. A member 37 is provided between the upper electrode 36 and an upper end portion of the chamber main body 12. The member 37 is made of an insulating material. The member 37 may be made of ceramic, for example, quartz. Further, in the exemplary embodiment, the member 37 and a part of a grounding conductor to be described later may be provided between the upper electrode 36 and the upper end portion of the chamber main body 12.

In the exemplary embodiment, the upper electrode 36 constitutes a shower head. According to the exemplary embodiment, the upper electrode 36 includes a ceiling plate 38 and a supporting body 40. The ceiling plate 38 is made of, by way of example, but not limitation, silicon. Alternatively, the ceiling plate 38 may be prepared by forming a film made of ceramic such as yttrium oxide on a surface of a base member made of aluminum. The ceiling plate 38 is provided with a multiple number of gas discharge openings 38h passing through the ceiling plate 38 in a plate thickness direction.

The supporting body 40 is provided on the ceiling plate 38. The supporting body 40 is configured to support the ceiling plate 38 in a detachable manner. The supporting body 40 is made of a conductive material such as aluminum. A gas diffusion space 40d is formed within the supporting body 40. The supporting body 40 is provided with a multiple number of holes 40h extended downwards from the gas diffusion space 40d. These holes 40h respectively communicate with the gas discharge openings 38h.

The gas diffusion space 40d is connected with a gas supply unit 41. The gas supply unit 41 is configured to supply a gas into the internal space 12s. The gas supply unit 41 is configured to output a plurality of gases used in the method MT. Further, the gas supply unit 41 is equipped with a plurality of flow rate controllers and a plurality of valves, and configured to adjust a flow rate of one or more gases to be outputted individually. The gas outputted from the gas supply unit 41 is discharged into the internal space 12s from the multiple number of gas discharge openings 38h via the gas diffusion space 40d and the multiple number of holes 40h.

The supporting body 40 is provided with a path 40p formed therein. The path 40p is connected to a chiller unit 42. A coolant such as cooling water is circulated between the path 40p and the chiller unit 42. A temperature of the upper electrode 36 is adjusted by heat exchange between the upper electrode 36 and the coolant supplied into the path 40p from the chiller unit 42.

The plasma processing apparatus 10 further includes a first high frequency power supply 43 and a second high frequency power supply 44. The first high frequency power supply 43 and the second high frequency power supply 44 are provided at the outside of the chamber main body 12. The first high frequency power supply 43 is configured to generate a first high frequency power for plasma generation. The first high frequency power may have a frequency of, for example, but not limitation, 100 MHz. The first high frequency power supply 43 is electrically connected to the upper electrode 36 via a matching device 45 and a power feed conductor 48. The matching device 45 is equipped with a matching circuit configured to match an output impedance of the first high frequency power supply 43 and an impedance at a load side (upper electrode 36 side). A lower end of the power feed conductor 48 is connected to the upper electrode 36. The power feed conductor 48 is extended upwards from the upper electrode 36. The power feed conductor 48 includes a cylindrical or rod-shaped conductor, and a central axis thereof substantially coincides with the central axis AX.

The second high frequency power supply 44 is configured to generate a second high frequency power mainly for ion attraction into the processing target object W, that is, a high frequency bias power. A frequency of the second high frequency power is lower than the frequency of the first high frequency power. In the exemplary embodiment, the frequency of the second high frequency power may be set to be higher than 13.56 MHz. In the exemplary embodiment, the frequency of the second high frequency power may be equal to or higher than 40 MHz. In the exemplary embodiment, the frequency of the second high frequency power may be equal to or higher than 60 MHz. The second high frequency power supply 44 is electrically connected to the lower electrode 18 via a matching device 46. The matching device 46 is equipped with a matching circuit configured to match an output impedance of the second high frequency power supply 44 and the impedance at the load side (lower electrode 18 side).

The plasma processing apparatus 10 is further equipped within a grounding conductor 50. The grounding conductor 50 has conductivity. The grounding conductor 50 is made of a metal such as aluminum. The grounding conductor 50 is grounded. The grounding conductor 50 is extended above the chamber main body 12 to cover the upper electrode 36. The power feed conductor 48 is upwardly extended to an outside of the grounding conductor 50 through a space surrounded by the grounding conductor 50 and connected to the first high frequency power supply 43 at the outside of the grounding conductor 50 via the matching device 45.

In the internal space 12s of the chamber main body 12 of the plasma processing apparatus 10, there may be formed an electric field intensity distribution in which an electric field intensity is high at a center side of the processing target object W but is low at an edge side of the processing target object W. That is, a non-uniform electric field intensity distribution in which the electric field intensity decreases with a rise of a distance from the central axis AX in a radial direction (that is, in a diametrical direction) may be formed in the internal space 12s. Under the non-uniform electric field intensity distribution, a plasma density is high in the vicinity of the central axis and is low at a place far from the central axis. That is, there is formed a plasma density distribution which is non-uniform in the radial direction with respect to the central axis. In view of this, the plasma processing apparatus 10 is further equipped with an electromagnet 60 to achieve a uniform plasma density distribution.

As depicted in FIG. 3, the electromagnet 60 is provided above the upper electrode 36. In the internal space 12s of the chamber main body 12, the electromagnet 60 forms a magnetic field distribution in which a horizontal component at a position far from the central axis AX is larger than that on the central axis AX. That is, the electromagnet 60 forms in the internal space 12s the magnetic field distribution in which the magnitude of the horizontal component increases with the rise of the distance from the central axis AX in the radial direction. At a place where the magnetic field having the large horizontal component is formed, a length of time during which electrons stay at this place is lengthened. As a result, at the place where the magnetic field having the large horizontal component is formed, a plasm density is increased. Therefore, according to the plasma processing apparatus 10, a plasma density distribution which is uniform in the radial direction with respect to the central axis AX is obtained. Hence, according to the plasma processing apparatus 10, processing uniformity within the surface of the processing target object W is improved.

In the exemplary embodiment, the electromagnet 60 includes a yoke 62 and a coil 64. The yoke 62 is made of a magnetic material. The yoke 62 has a base portion 62a and a plurality of cylindrical portions 62b. The base portion 62a has a substantially disk shape and is extended in a direction perpendicular to the central axis AX. Each of the plurality of cylindrical portions 62b has a cylindrical shape and is extended downwards from the base portion 62a. The cylindrical portions 62b are coaxially arranged with respect to the central axis AX. The coil 64 is wound around the central axis AX. The coil 64 is provided between two adjacent cylindrical portions 62b in the diametrical direction. Further, the electromagnet 60 has one or more coils 64. In a configuration in which the number of the coils 64 of the electromagnet 60 is plural, the coils 64 may be arranged coaxially with respect to the central axis AX.

The coil 64 of the electromagnet 60 is connected to a current source 66 via a wiring 68. If a current is applied to the coil 64 from the current source 66, a magnetic field is formed by the electromagnet 60. Since both an effect of confining the electrons (an effect of suppressing diffusion of the electrons) in the radial direction and an effect of suppressing extinguishment of the electrons (an effect of suppressing the electrons from reaching the electrode) are accomplished at a place where an angle of a vector of the magnetic field formed by the electromagnet 60 is 45°, the plasm density is increased at this place. Accordingly, in case that the processing target object W has a radius of 150 mm, the electromagnet 60 may be configured such that a distance between the place where the angle of the vector of the magnetic field is 45° and the central axis AX is in a range from 135 mm to 185 mm inclusive. For this reason, in the exemplary embodiment, an average of an inner diameter and an outer diameter of the single coil 64 of the electromagnet 60 is equal to or larger than a distance between the central axis AX and the edge of the processing target object W. In case that the radius of the processing target object W is 150 mm, the average of the inner diameter and the outer diameter of the single coil 64 of the electromagnet 60 is in a range from 150 mm to 250 mm inclusive. Furthermore, the angle of the vector of the magnetic field is 0° when this vector has only a downward component (vertical component), and is 90° when this vector has only a radial component (horizontal component). Thus, when the angle of the vector of the magnetic field is 45°, this magnetic field has both a horizontal component and a vertical component.

If the electromagnet 60 is placed in the space surrounded by the grounding conductor configured to cover the upper electrode, the first high frequency power is introduced to the electromagnet 60 and/or the wiring configured to connect the electromagnet 60 and the power source (current source). As a result, the electric field intensity in the internal space 12s of the chamber main body 12 is locally changed. In view of this problem, the electromagnet 60 is disposed at the outside of the grounding conductor. If, however, the electromagnet 60 is placed in a space above an upper end of the grounding conductor, a vertical distance from the electromagnet 60 to the internal space 12s is lengthened, so that a magnetic field having a sufficient magnitude cannot be formed within the internal space 12s unless a large current is applied to the coil 64. Further, if the electromagnet 60 is disposed at a lateral side of the grounding conductor (that is, at the outside of the grounding conductor in the radial direction from the central axis), the place where the magnetic field having the large horizontal component is formed or the place where the magnetic field whose vector has an angle of 45° is formed is not formed within the internal space 12s. In this regard, to efficiently form the magnetic field distribution suitable for obtaining the uniform plasma density distribution in the internal space 12s, the grounding conductor 50 provides an external space ES in which the electromagnet 60 is placed. The external space ES is located closer to the internal space 12s than the upper end of the grounding conductor 50 is. Further, the external space ES is upwardly located apart from the upper electrode 36 and shielded with respect to the upper electrode 36 by the grounding conductor 50.

The grounding conductor 50 has a first portion 51, a second portion 52 and a third portion 53. The first portion 51 has a cylindrical shape. A central axis of the first portion 51 substantially coincides with the central axis AX. The first portion 51 is extended upwards from the chamber main body 12. In the example shown in FIG. 3, the first portion 51 is extended upwards from an upper end of the sidewall 12a of the chamber main body 12. A lower end portion of the first portion 51 is sandwiched between the member 37 and the upper end of the sidewall 12a.

The second portion 52 is upwardly spaced apart from the upper electrode 36 and extended from the first portion 51 toward the central axis AX. The second portion 52 has a plate shape extended in a direction intersecting with or perpendicular to the central axis AX. The first portion 51 and the second portion 52 provide a first space IS1 above the upper electrode 36. The first space IS1 is a part of a space of the grounding conductor 50 at an inner side thereof (that is, the upper electrode 36 side). By providing this first space IS1, there is secured a distance between the upper electrode 36 and the grounding conductor 50 in the vertical direction. Accordingly, a capacitive coupling between the grounding conductor 50 and the upper electrode 36 is suppressed. A distance between a top surface of the upper electrode 36 and a bottom surface of the second portion 52 of the grounding conductor 50 may be set to be equal to or larger than, e.g., 60 mm.

The third portion 53 has a cylindrical shape. A central axis of the third portion 53 substantially coincides with the central axis AX. The third portion 53 is extended at a position closer to the central axis than the first portion 51 is. The third portion 53 is extended upwards from the second portion 52. The third portion 53 provides a second space IS2. The second space IS2 is a space inside the second portion 52 and a part of the space of the grounding conductor 50 at the inner side thereof (that is, the upper electrode 36 side). The second space IS2 is continuous with the first space IS1. Further, the power feed conductor 48 is extended upwards through the first space IS1 and the second space IS2.

The external space ES is provided by the grounding conductor 50 at an outside of the third portion 53, on the second portion 52 and above the internal space 12s. At the outside of the third portion 53 and on the second portion 52, the external space ES is extended in a circumferential direction with respect to the central axis AX. The electromagnet 60 is disposed in this external space ES. Further, a vertical distance between a lower end of the electromagnet 60 placed in the external space ES and the top surface of the upper electrode 36 may be larger than 60 mm, and a vertical distance between the lower end of the electromagnet 60 and the processing target object W placed on the supporting table 14 may be equal to or smaller than 230 mm.

A distance between the electromagnet 60 placed within the external space ES and the internal space 12s is relatively short. Further, as stated above, the electromagnet 60 forms within the internal space 12s the magnetic field distribution in which the horizontal component in the vicinity of the central axis AX is large whereas the horizontal component at the place far from the central axis is small. Accordingly, the magnetic field distribution suitable for obtaining the uniform plasma density distribution can be efficiently formed within the internal space 12s by the electromagnet 60 placed at the outside of the grounding conductor 50.

As mentioned above, the current source 66 is connected to the coil 64 of the electromagnet 60. The electromagnet 60 and the current source 66 are placed at the outside of the grounding conductor 50. Therefore, a filter configured to suppress an introduction of the high frequency power into the current source 66 need not be provided between the coil 64 and the current source 66.

In the exemplary embodiment, the grounding conductor 50 further includes a fourth portion 54, a fifth portion 55 and a sixth portion 56. Above the second portion 52, the fourth portion 54 is extended from the third portion 53 in the radial direction with respect to the central axis AX. The fourth portion 54 is of a plate shape extended in a direction intersecting with or perpendicular to the central axis AX. The fifth portion 55 has a cylindrical shape. A central axis of the fifth portion 55 substantially coincides with the central axis AX. The fifth portion 55 is spaced farther from the central axis than the third portion 53 and extended upwards from the fourth portion 54. Above the fourth portion 54, the sixth portion 56 is extended from the fifth portion 55 toward the central axis AX. The sixth portion 56 is of a plate shape extended in a direction intersecting with or perpendicular to the central axis AX. In the present exemplary embodiment, the grounding conductor 50 is further equipped with a cover member 57 extended from the sixth portion to near the power feed conductor 48.

The fourth portion 54, the fifth portion 55 and the sixth portion 56 provide a third space IS3. The third space IS3 is a space surrounded by the fourth portion 54, the fifth portion 55 and the sixth portion 56, and is a part of the space within the grounding conductor 50. The third space IS3 is continuous with the second space IS2. The power feed conductor 48 is extend upwards through the third space IS3 as well.

Further, in the example shown in FIG. 3, the first portion to sixth the portion are implemented by three members. However, the number of the members constituting the grounding conductor 50 may not the limited thereto.

Figure 4:
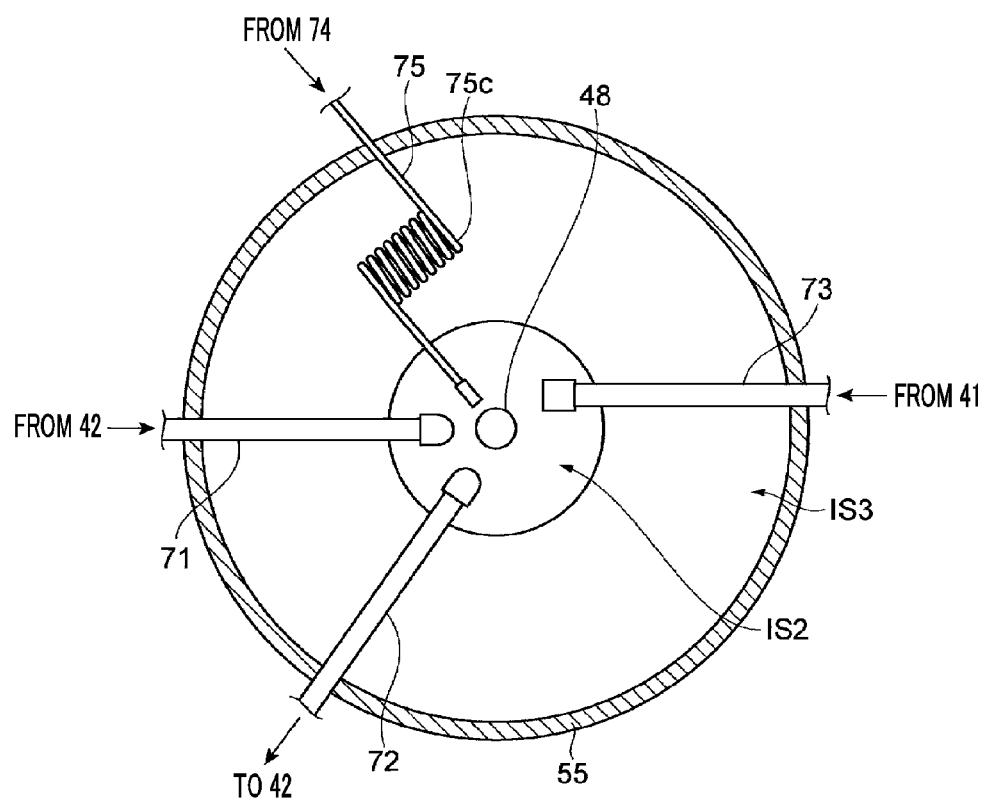
FIG. 4 is a plan view illustrating an internal configuration of a grounding conductor of the plasma processing apparatus shown in FIG. 3.

Now, reference is made to FIG. 4 as well as FIG. 3. FIG. 4 is a plan view illustrating an internal configuration of the grounding conductor of the plasma processing apparatus shown in FIG. 3. FIG. 4 illustrates a plan view of the fifth portion 55 of the grounding conductor 50 taken along a horizontal plane. In the exemplary embodiment, the plasma processing apparatus 10 is further equipped with a pipe 71, as depicted in FIG. 3 and FIG. 4. The pipe 71 is upwardly extended from the upper electrode 36 through the first space IS1 and the second space IS2 and horizontally extended to the outside of the grounding conductor 50 through the third space IS3. The pipe 71 is connected to the chiller unit 42 at the outside of the grounding conductor 50. The coolant from the chiller unit 42 is supplied into the path 40p through the pipe 71. Within the third space IS3, the pipe 71 is substantially shielded with respect to the upper electrode 36 by the fourth portion 54 of the grounding conductor 50.

The plasma processing apparatus 10 is further equipped with a pipe 72. The pipe 72 is upwardly extended through the first space IS1 and the second space IS2 and horizontally extended to the outside of the grounding conductor 50 through the third space IS3. The pipe 72 is connected to the chiller unit 42 at the outside of the grounding conductor 50. The coolant is returned back into the chiller unit 42 through the pipe 72 from the path 40p . Within the third space IS3, the pipe 72 is substantially shielded with respect to the upper electrode 36 by the fourth portion 54 of the grounding conductor 50.

In the exemplary embodiment, the plasma processing apparatus 10 is further equipped with a pipe 73. The pipe 73 is upwardly extended from the upper electrode 36 through the first space IS1 and the second space IS2 and horizontally extended to the outside of the grounding conductor 50 through the third space IS3. The pipe 73 is connected to the gas supply unit 41 at the outside of the grounding conductor 50. The gas outputted from the gas supply unit 41 is supplied to the upper electrode 36, that is, the shower head through the pipe 73. Within the third space IS3, the pipe 73 is substantially shielded with respect to the upper electrode 36 by the fourth portion 54 of the grounding conductor 50. Furthermore, the gas supply unit 41 and the upper electrode 36 (that is, the shower head) may be connected to each other by multiple pipes.

According to the exemplary embodiment, the plasma processing apparatus 10 is further equipped with a DC power supply 74 and a wiring 75. The DC power supply 74 is configured to generate a negative DC voltage to be applied to the upper electrode 36. The wiring 75 is configured to connect the DC power supply 74 and the upper electrode 36. The wiring 75 may include a coil 75c . The coil 75c is provided in the third space IS3. The wiring 75 is extended upwards from the upper electrode 36 through the first space IS1 and the second space IS2 and horizontally extended to the outside of the grounding conductor 50 through the third space IS3. The wiring 75 is electrically insulated from the fifth portion 55 and the grounding conductor 50. The wiring 75 is connected to the DC power supply 74 at the outside of the grounding conductor 50. Within the third space IS3, the wiring 75 is substantially shielded with respect to the upper electrode 36 by the fourth portion 54 of the grounding conductor 50.

In the exemplary embodiment, the plasma processing apparatus 10 further includes a control unit 80. The control unit 80 is configured to control individual components of the plasma processing apparatus 10. The control unit 80 may be implemented by a computer device. The control unit 80 may include a processor, a storage device such as a memory, an input device such as a keyboard, a mouse or a touch panel, a display device, an input/output interface of control signals, and so forth. The storage device stores therein control programs and recipe data. The processor of the control unit 80 executes the control programs and outputs control signals based on the recipe data to control the individual components of the plasma processing apparatus 10. The control unit 80 is capable of controlling the individual components of the plasma processing apparatus 10 to implement the method MT.

Figure 5:
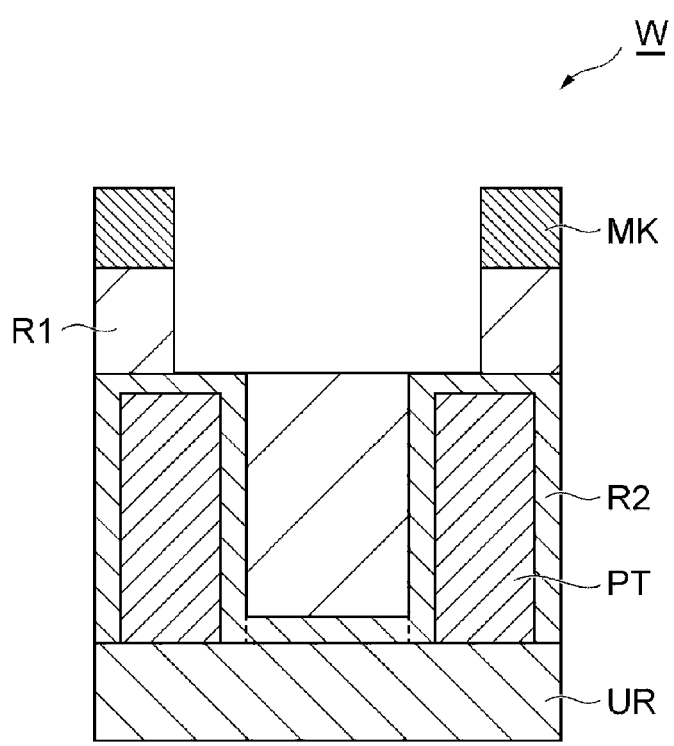
FIG. 5 is a partially enlarged cross sectional view of the processing target object processed from the state shown in FIG. 2.
Figure 6A:
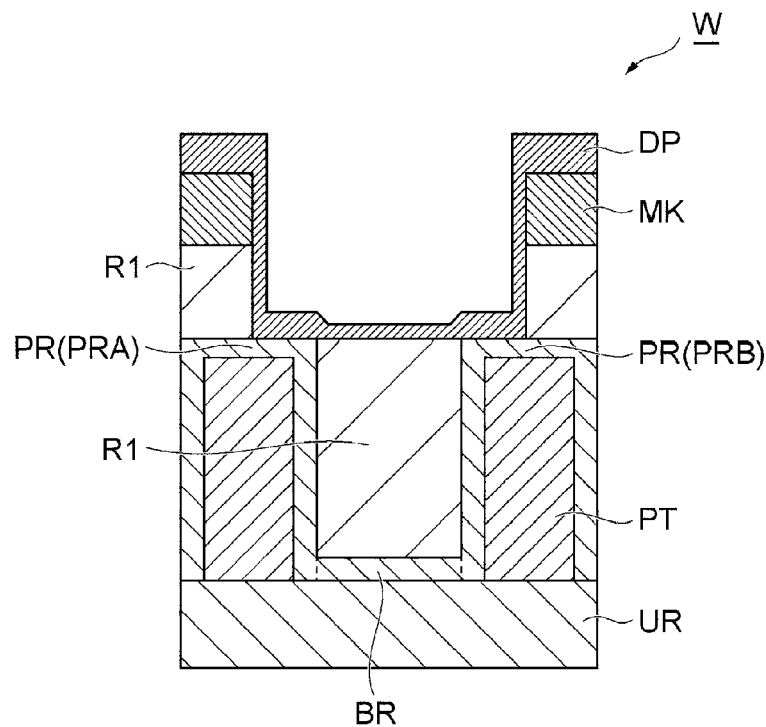
FIG. 6A is a partially enlarged cross sectional view of the processing target object after a process ST11 of the etching method shown in FIG. 1 is performed.
Figure 6B:
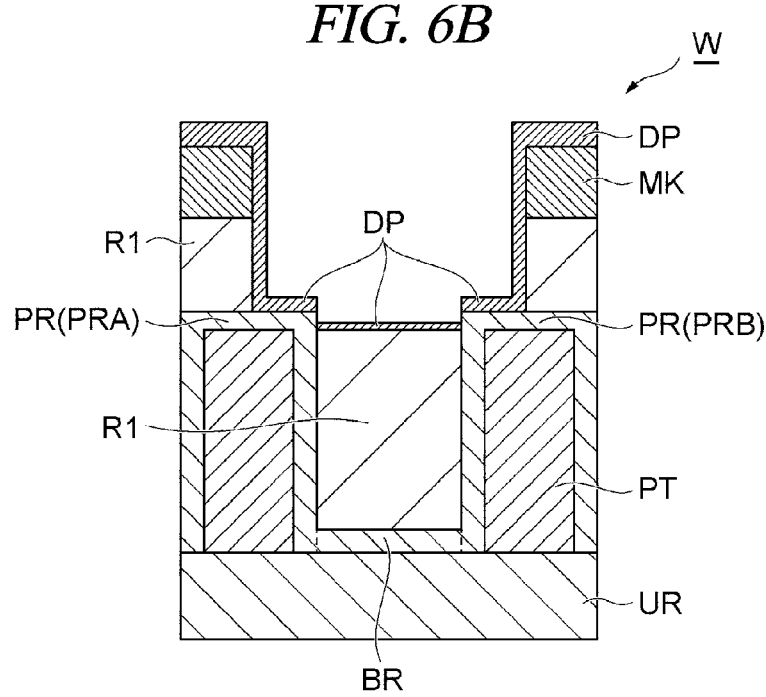
FIG. 6B is a partially enlarged cross sectional view of the processing target object after a process ST12 of the etching method shown in FIG. 1 is performed.
Figure 7:
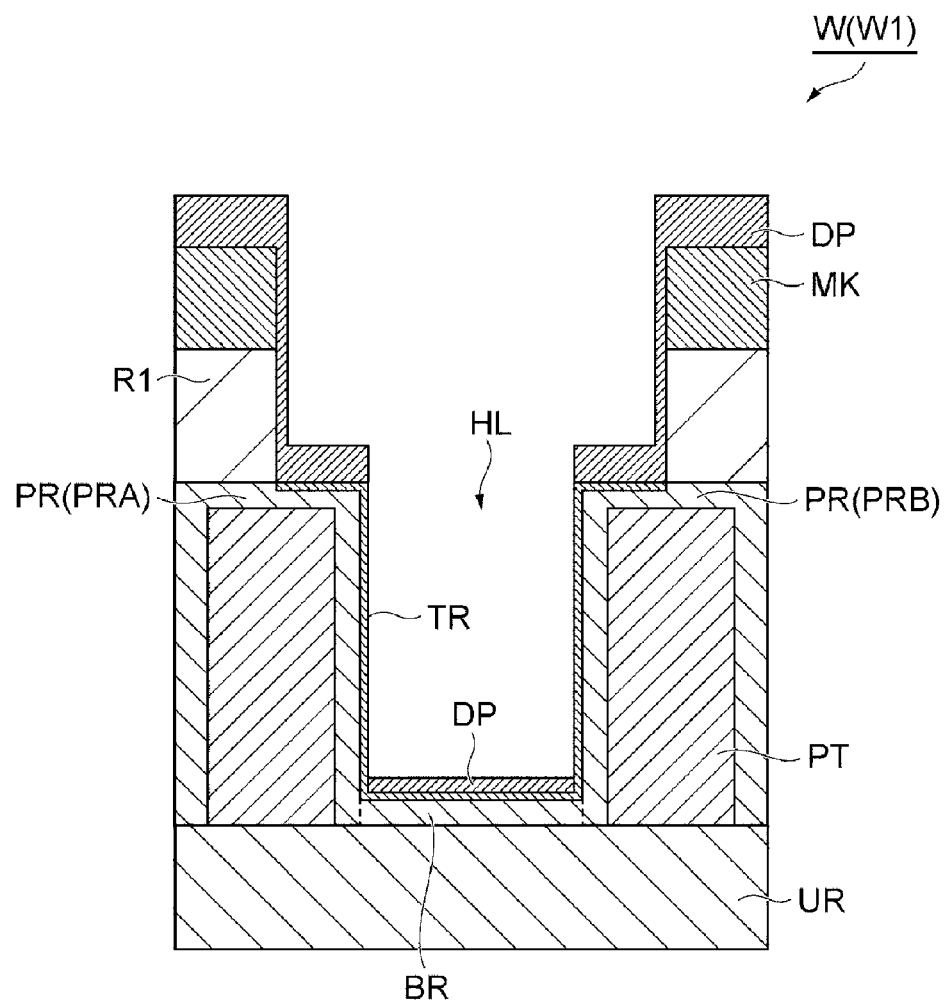
FIG. 7 is a partially enlarged cross sectional view of the processing target object after a process ST1 of the etching method shown in FIG. 1 is performed.
Figure 8:
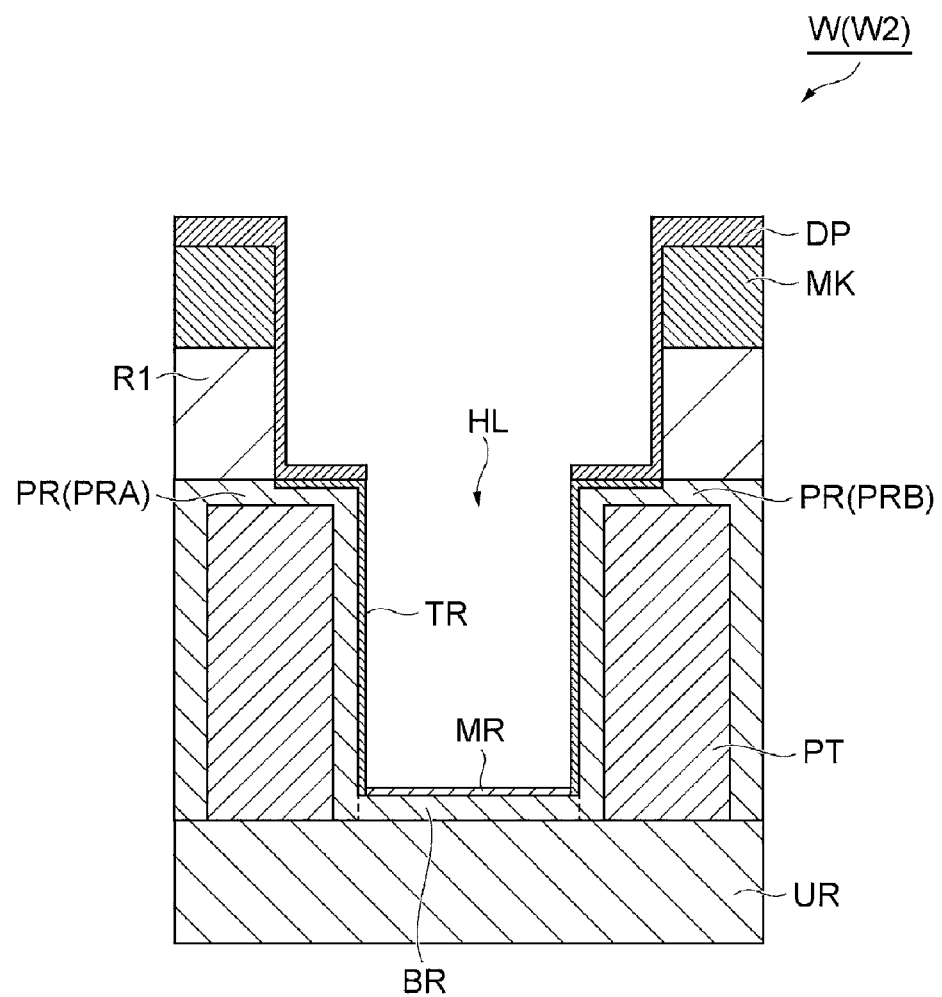
FIG. 8 is a partially enlarged cross sectional view of the processing target object after a process ST2 of the etching method shown in FIG. 1 is performed.
Figure 9:
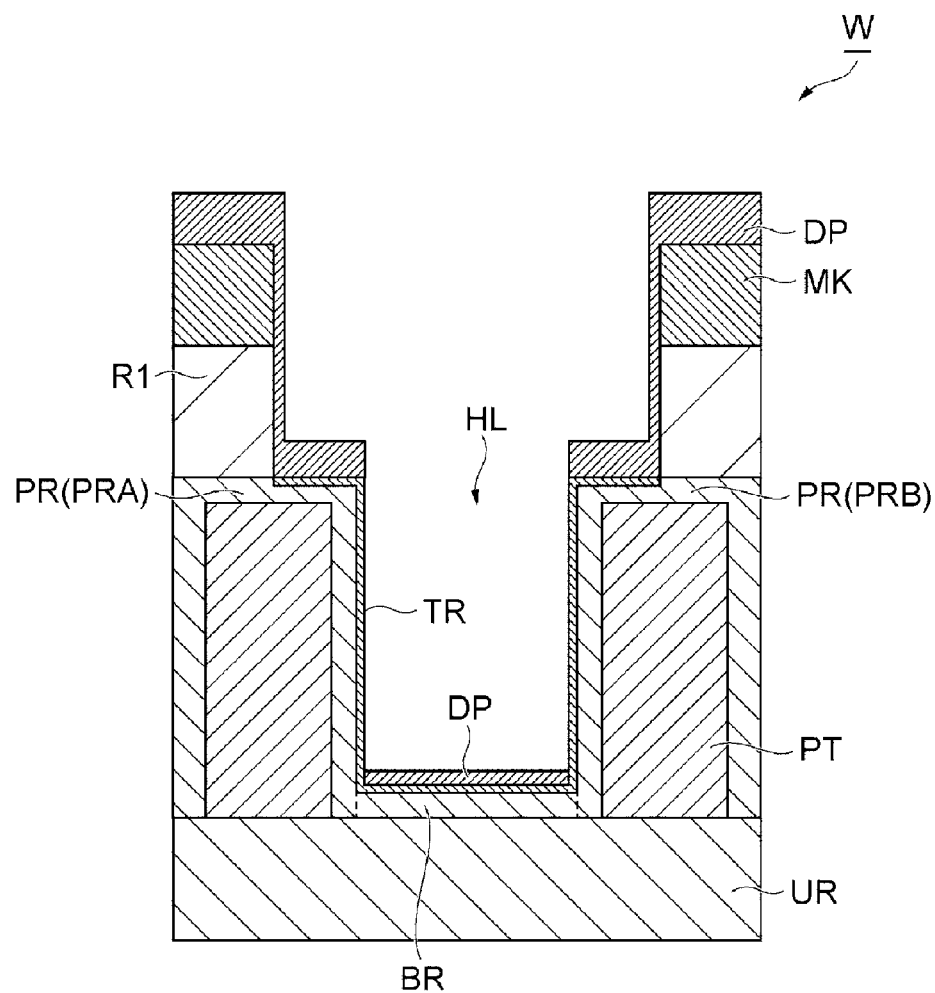
FIG. 9 is a partially enlarged cross sectional view of the processing target object after a process ST32 of the etching method shown in FIG. 1 is performed.
Figure 10:
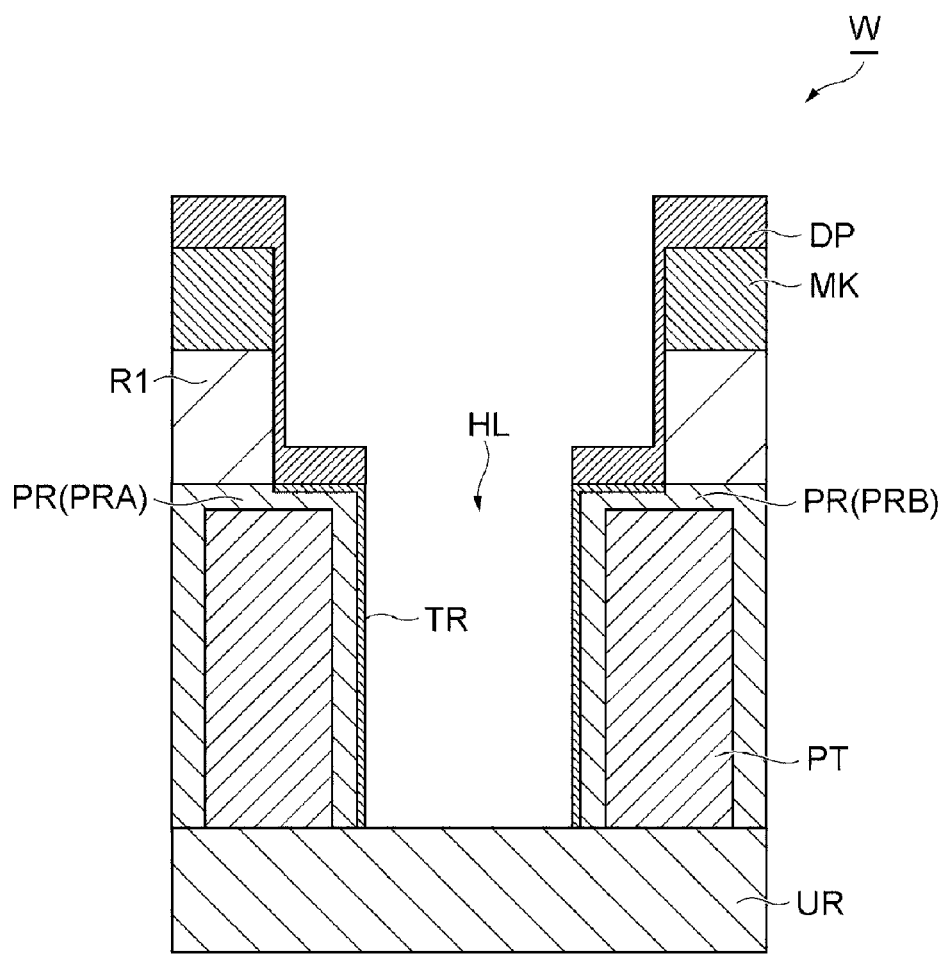
FIG. 10 is a partially enlarged cross sectional view of the processing target object after the etching method shown in FIG. 1 is completed.

Referring back to FIG. 1, the method MT will be explained for an example case where the method MT is performed on the processing target object W shown in FIG. 2 by using the plasma processing apparatus 10. Now, reference is made to FIG. 5, FIG. 6A, FIG. 6B, FIG. 7, FIG. 8, FIG. 9 and FIG. 10 as well as FIG. 1. FIG. 5 is a partially enlarged cross sectional view of the processing target object processed from the state shown in FIG. 2. FIG. 6A is a partially enlarged cross sectional view of the processing target object after a process ST11 of the etching method shown in FIG. 1 is performed. FIG. 6B is a partially enlarged cross sectional view of the processing target object after a process ST12 of the etching method shown in FIG. 1 is performed. FIG. 7 is a partially enlarged cross sectional view of the processing target object after a process ST1 of the etching method shown in FIG. 1 is performed. FIG. 8 is a partially enlarged cross sectional view of the processing target object after a process ST2 of the etching method shown in FIG. 1 is performed. FIG. 9 is a partially enlarged cross sectional view of the processing target object after a process ST32 of the etching method shown in FIG. 1 is performed. FIG. 10 is a partially enlarged cross sectional view of the processing target object after the etching method shown in FIG. 1 is completed.

The method MT includes the process ST1, the process ST2 and a process ST3. In the process ST1, the first region R1 is etched. The first region R1 may be etched only through the process ST1. Alternatively, prior to performing the process ST1, the first region R1 may be etched by another plasma etching processing until the second region R2 is exposed (see FIG. 5) or immediately before the second region R2 is exposed. By way of example, the first region R1 may be etched by active species such as ions and/or radicals from plasma of a fluorocarbon gas until the second region R2 is exposed or immediately before the second region R2 is exposed.

The process ST1 includes the process ST11 and the process ST12. In the process ST11, plasma of a first processing gas is generated to form a deposit DP of fluorocarbon on the first region R1. The first processing gas includes a fluorocarbon gas. The first processing gas may include an oxygen gas and a rare gas such as an Ar gas as well as the fluorocarbon gas. In the process ST11, the deposit DP is also formed on an exposed portion of the second region R2 (on the projected regions PR). As depicted in FIG. 6A, the deposit DP is formed such that a thickness of the deposit DP on the second region R2 is larger than a thickness of the deposit DP on the first region R1.

In the process ST11, the first processing gas is supplied into the internal space 12s, and the exhaust device 34 is controlled such that a pressure within the internal space 12s is regulated to a preset pressure. In the process ST11, as the first high frequency power is supplied, the first processing gas is excited in the internal space 12s. As a result, plasma of the first processing gas is generated within the internal space 12s. In the process ST11, a power level of the second high frequency power is set to be lower than a power level of the second high frequency power in the process ST12. In the process ST11, the second high frequency power may not be supplied to the lower electrode 18.

In the process ST11, a temperature of the processing target object W is set to be in a range from 20° C. to 250° C. inclusive. The temperature of the processing target object W is adjusted by the heat exchange medium supplied into the path 18p and the aforementioned one or more heaters provided within the electrostatic chuck 20. If the processing target object W reaches this set temperature, the deposit DP containing the fluorocarbon is formed on the processing target object W, as shown in FIG. 6A. As depicted in FIG. 6A, the thickness of the deposit DP on the second region R2 is large whereas the thickness of the deposit DP on the first region R1 is small. Further, the temperature exceeding 250° C. is a glass transition temperature of the mask MK, and a difference between the thickness of the deposit DP on the firs region R1 and the thickness of the deposit DP on the second region R2 is reduced at this temperature. Further, the difference between the thickness of the deposit DP on the first region R1 and the thickness of the deposit DP on the second region R2 is also reduced at a temperature lower than 20° C.

In the process ST12, to etch the first region R1 by supplying ions of the rare gas toward the processing target object W on which the deposit DP is formed, first plasma of the rare gas is generated. In the process ST12, the rare gas is supplied into the internal space 12s, and the exhaust device 34 is controlled such that the pressure within the internal space 12s is regulated to a set pressure. Further, in the process ST12, as the first high frequency power is supplied, the first plasma of the rare gas is generated in the internal space 12s. Furthermore, in the process ST12, the second high frequency power is supplied to the lower electrode 18. In the process ST12, the power level of the second high frequency power is set to be higher than the power level of the second high frequency power in the process ST11.

In the process ST12, the ions of rare gas atoms from the first plasma are irradiated to the processing target object W. If the ions of the rare gas atoms are irradiated to the deposit DP, the first region R1 is etched by the radicals in the fluorocarbon contained in the deposit DP. Meanwhile, on the second region R2, the deposit DP protects the second region R2 from being etched, though the amount of the deposit DP is reduced. If the process ST12 is performed, the processing target object W shown in FIG. 6A turns into a state shown in FIG. 6B.

In a subsequent process ST13, it is determined whether a stop condition is satisfied. In the process ST13, it is determined that the stop condition is satisfied when a repetition number of a sequence including the process ST11 and the process ST12 reaches a preset number of times. If it is determined in the process ST13 that the stop condition is not satisfied, the sequence including the process ST11 and the process ST12 is performed again. Meanwhile, if it is determined in the process ST13 that the stop condition is met, the process ST1 is finished.

In the process ST1, by alternately repeating the process ST11 and the process ST12, the first region R1 within the recess provided by the second region R2 is removed, so that a hole HL is formed, as depicted in FIG. 7. That is, the hole HL is formed in a self-aligned manner. Further, by performing the process ST1, a part of the second region R2 including a surface thereof is turned into a modified region TR containing carbon, as depicted in FIG. 7. The repetition number of the sequence including the process ST11 and the process ST12 may be one time. Further, various conditions for the process ST11 and the process ST12 are set such that the etching of the first region R1 is not stopped because of an excessive amount of the deposit DP on the processing target object W and such that the second region R2 is not etched because of a lack of the deposit DP.

If the width of the recess provided by the second region R2 is narrow, the deposit is formed thick on the first region R1 within the narrow recess as a result of performing the process ST11. If the deposit is formed thick on the first region R1, the etching of the first region R1 may not proceed in the process ST12. Accordingly, if the width of the recess provided by the second region R2 is narrow, the thickness of the deposit formed on the processing target object W needs to be decreased. If the thickness of the deposit is small, energy of the ions of the rare gas atoms irradiated to the processing target object W need to be reduced in order to suppress the second region R2 from being etched. The energy of the ions is reduced by using the second high frequency power having a higher frequency. By way of example, the second high frequency power having a frequency larger than 13.56 MHz, for example, a frequency equal to or larger than 40 MHz or 60 MHz may be used. If the second high frequency power having such a high frequency is used, the aforementioned non-uniformity of the distribution of the electric field intensity formed in the process ST12 becomes more conspicuous. In the present exemplary embodiment, the non-uniformity of the plasma density distribution caused by this non-uniform distribution of the electric field intensity may be resolved or suppressed by generating the aforementioned magnetic field by the electromagnet 60 in the process ST12. That is, in the process ST12 according to the exemplary embodiment, the electromagnet 60 forms a magnetic field distribution in which a horizontal component at the edge of the processing target object W is larger than a horizontal component on the center of the processing target object W.

As discussed above, during the process ST1, the deposit DP is formed as the plasma of the first processing gas is generated. The deposit DP is formed thick at a position close to a surface of the processing target object whereas the deposit DP is formed thin at a position far from the surface of the processing target object, that is, at a deep position. Accordingly, after the process ST1 is performed, as depicted in FIG. 7, the thickness of the deposit DP formed on the top surfaces of the projected regions PR becomes larger than that of the deposit DP formed on the bottom portion BR. That is, after the process ST1, a thickness of the deposit DP of a processing target object W1 (the processing target object W after the first region R1 is etched) has a distribution.

In the method MT, the process ST2 is subsequently performed. In the process ST2, by selectively modifying the bottom region BR, a modified region MR is formed, as shown in FIG. 8. In the process ST2, plasma of a second processing gas is generated. The second processing gas includes hydrogen. The second processing gas may include a hydrogen gas. The second processing gas may further include a nitrogen gas in addition to the hydrogen gas. Alternatively, the second processing gas may include a rare gas in addition to the hydrogen gas. In the process ST2, ions of the hydrogen from the plasma of the second processing gas are supplied to the processing target object W1. In the process ST2, the ions of the hydrogen are attracted into the processing target object W1 by the high frequency bias power.

To elaborate, in the process ST2, the second processing gas is supplied into the internal space 12s, and the exhaust device 34 is controlled such that the pressure within the internal space 12s is regulated to a preset pressure. Further, in the process ST2, as the first high frequency power is supplied, the plasma of the second processing gas is generated within the internal space 12s. Furthermore, in the process ST2, the second high frequency power is supplied to the lower electrode 18.

On the processing target object W1, the deposit DP has the above-stated thickness distribution. Accordingly, if the hydrogen ions are irradiated to the processing target object W1, the hydrogen ions do not reach upper portions of the projected regions PR on which the deposit DP is formed thick. Meanwhile, since the thickness of the deposit DP is small on the bottom region BR, the deposit DP on the bottom region BR is removed by the hydrogen ions, and the hydrogen ions are supplied into the bottom region BR. As a result, the carbon is removed from the modified region TR within the bottom region BR by the hydrogen ions, and the bottom region BR is modified at least partially, so that a modified region MR is formed. To elaborate, a region within the bottom portion BR where the hydrogen is introduced is the modified region MR.

In the process ST2 according to the exemplary embodiment, the electromagnet 60 forms the magnetic field distribution in which the horizontal component at the edge of the processing target object W is larger than the horizontal component on the center of the processing target object W. If this magnetic field is formed, the non-uniformity of the plasma density distribution is reduced even if the non-uniform electric field intensity distribution is formed within the internal space 12s. As a result, the non-uniformity in the processing of the process ST2 within the surface is diminished. Therefore, the non-uniformity in the etching rate of the bottom region BR is reduced when performing the process ST3 to be described below.

In the method MT, the process ST3 is then performed. In the process ST3, the modified region MR is etched. The process ST3 is the same process as the process ST1 and includes the process ST31 and the process ST32. In the process ST31, plasma of a third processing gas is generated to form the deposit DP of fluorocarbon on a processing target object W2 (the processing target object W having the modified region MR). The third processing gas is the same as the first processing gas and includes the fluorocarbon gas. The third processing gas may include the oxygen gas and the rare gas such as an Ar gas as well as the fluorocarbon gas. A thickness of the deposit DP formed in the process ST31 is thick on the top surfaces of the projected regions PR and is thin on the modified region MR.

In the process ST31, the third processing gas is supplied into the internal space 12s, and the exhaust device 34 is controlled such that the pressure within the internal space 12s is regulated to a predetermined pressure. Further, in the process ST31, as the first high frequency power is supplied, the third processing gas is excited within the internal space 12s. As a result, the plasma of the third processing gas is generated within the internal space 12s. In the process ST31, a power level of the second high frequency power is set to be lower than a power level of the second high frequency power in the process ST32. In the process ST31, the second high frequency power may not be applied to the lower electrode 18.

In the process ST31, the temperature of the processing target object W is set to be in a range from 20° C. to 250° C. inclusive. The temperature of the processing target object W is adjusted by the heat exchange medium supplied into the path 18p and the aforementioned one or more heaters provided within the electrostatic chuck 20.

In the subsequent process ST32, second plasma of the rare gas is generated to etch the modified region MR by supplying ions of the rare gas atoms toward the processing target object W2 on which the deposit DP is formed. In the process ST32, the rare gas is supplied into the internal space 12s, and the exhaust device 34 is controlled such that the pressure within the internal space 12s is regulated to a preset pressure. Further, in the process ST32, as the first high frequency power is supplied, the second plasma of the rare gas is generated within the internal space 12s. Furthermore, in the process ST32, the second high frequency power is applied to the lower electrode 18. The power level of the second high frequency power in the process ST32 is set to be higher than the power level of the second high frequency power in the process ST31.

In the process ST32, the ions of the rare gas atoms from the second plasma are irradiated toward the processing target object W2. If the ions of the rare gas atoms are irradiated to the deposit DP, the modified region MR is etched by radicals of the fluorocarbon in the deposit DP. Meanwhile, on the projected regions PR, the deposit DP protects the projected regions PR from being etched, though the amount of the deposit DP is reduced.

In a subsequent process ST33, it is determined whether a stop condition is satisfied. In the process ST33, it is determined that the stop condition is satisfied when a repetition number of a sequence including the process ST31 and the process ST32 reaches a preset number of times. If it is determined in the process ST33 that the stop condition is not satisfied, the sequence including the process ST31 and the process ST32 is performed again. Meanwhile, if it is determined in the process ST33 that the stop condition is met, the process ST3 is finished.

In the process ST3, by alternately repeating the process ST31 and the process ST32, the modified region MR is removed, as illustrated in FIG. 9. The repetition number of the sequence including the process ST31 and the process ST32 may be one. Further, various conditions for the process ST31 and the process ST32 are set such that the etching of the modified region MR is not stopped because of the excessive amount of the deposit DP on the processing target object and such that the plurality of projected regions PR is not etched because of the lack of the deposit DP.

In the exemplary embodiment, it is determined in a process ST4 whether a stop condition is satisfied. In the process ST4, it is determined that the stop condition is satisfied when a repetition number of a sequence including the process ST2 and the process ST3 reaches a preset number of times. If it is determined in the process ST4 that the stop condition is not satisfied, the process ST2 and the process ST3 are performed again. Meanwhile, if it is determined in the process ST4 that the stop condition is met, the method MT is ended. Further, the repetition number of the sequence including the process ST2 and the process ST3 may be one or more times.

Upon the completion of the method MT, the bottom region BR is removed, as shown in FIG. 10. In this method MT, the modified region MR is selectively etched. Thus, according to this method MT, the bottom region BR is selectively etched with respect to the other regions belonging to the second region R2.

So far, the various exemplary embodiments have been described. However, the above-described exemplary embodiments are not meant to be anyway limiting, and various changes and modifications may be made. By way of example, the method MT may be performed by using a plasma processing apparatus other than the plasma processing apparatus 10, such as a capacitively coupled plasma processing apparatus different from the plasma processing apparatus 10, an inductively coupled plasma processing apparatus or a plasma processing apparatus configured to excite a gas by using a surface wave such as a microwave, or the like. Further, the plasma processing apparatus used in performing the process ST1 and the plasma processing apparatus used in performing the process ST2 may be different. Moreover, the plasma processing apparatus used in performing the process ST2 and the plasma processing apparatus used in performing the process ST3 may be different.

Below, an experiment conducted to evaluate the etching method according to the exemplary embodiment will be described. In the experiment, seven samples, that is, a first sample to a seventh sample having the same structure as that of the processing target object shown in FIG. 2 are prepared. Then, by using the plasma processing apparatus shown in FIG. 3, the method MT is performed on the first sample to the sixth sample. For the seventh sample, the method MT is performed by using the plasma processing apparatus shown in FIG. 3 without performing the process ST2. In the process ST2 of the method MT performed on the first sample and the second sample, a hydrogen gas ($H_2$ gas) of 300 sccm is used as the second processing gas. In the process ST2 of the method MT performed on the third sample and the fourth sample, a mixed gas of a hydrogen gas ($H_2$ gas) of 130 sccm and an Ar gas of 950 sccm is used as the second processing gas. In the process ST2 of the method MT performed on the fifth sample and the sixth sample, a mixed gas of a hydrogen gas ($H_2$ gas) of 225 sccm and a nitrogen gas ($N_2$ gas) of 75 sccm is used as the second processing gas. Further, a processing time of the process ST2 of the method MT performed on the first sample, the third sample and the fifth sample is 5 seconds, whereas a processing time of the process ST2 of the method MT performed on the second sample, the fourth sample and the sixth sample is 10 seconds.

Below, other conditions for the method MT performed on the seven samples are specified as follows.

<Conditions for the Method MT in the Experiment>

Repetition number of the sequence in the process ST1: 140 times

Conditions for the process ST11

First Processing Gas $C_4F_6$ gas of 3.4 sccm $O_2$ gas of 3.2 sccm

Ar gas of 400 sccm

First high frequency power: 60 MHz, 50 W

Second high frequency power: 40 MHz, 50 W

Pressure within the internal space 12s: 10 mTorr (1.33 Pa)

Processing time in the process ST11 of each sequence: 4 sec

Process ST12

Rare gas: Ar gas of 400 sccm

First high frequency power: 60 MHz, 50 W

Second high frequency power: 40 MHz, 200 W

Pressure within the internal space 12s: 10 mTorr (1.33 Pa)

Processing time in the process ST12 of each sequence: 3 sec

Figure 11A:
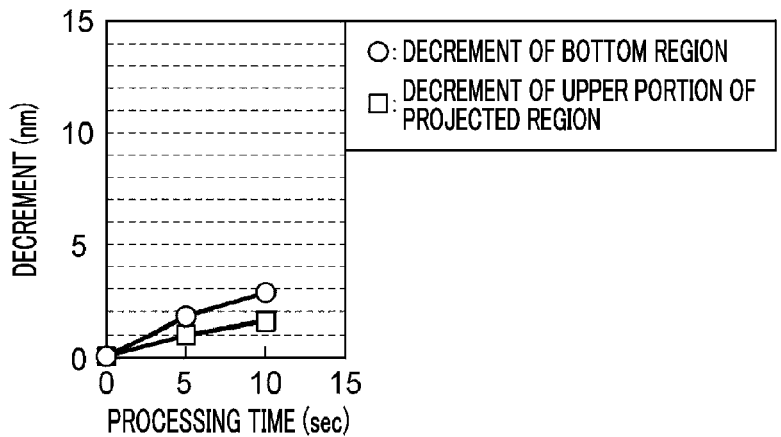
FIG. 11A is a graph showing a result of an experiment conducted upon a first sample, a second sample and a seventh sample.
Figure 11B:
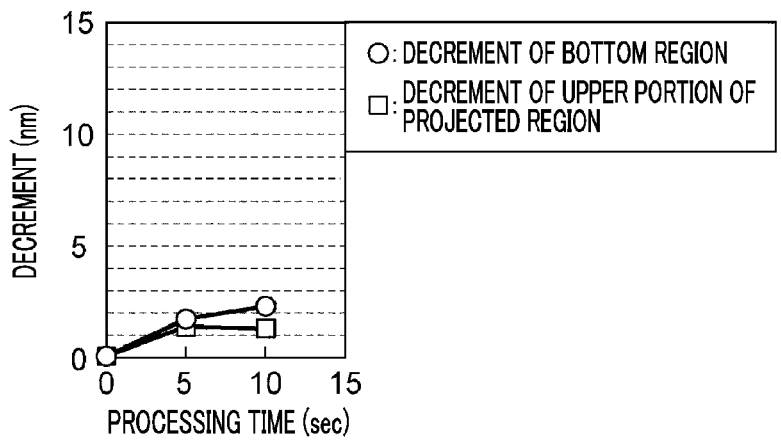
FIG. 11B is a graph showing a result of the experiment conducted upon a third sample, a fourth sample and the seventh sample.
Figure 11C:
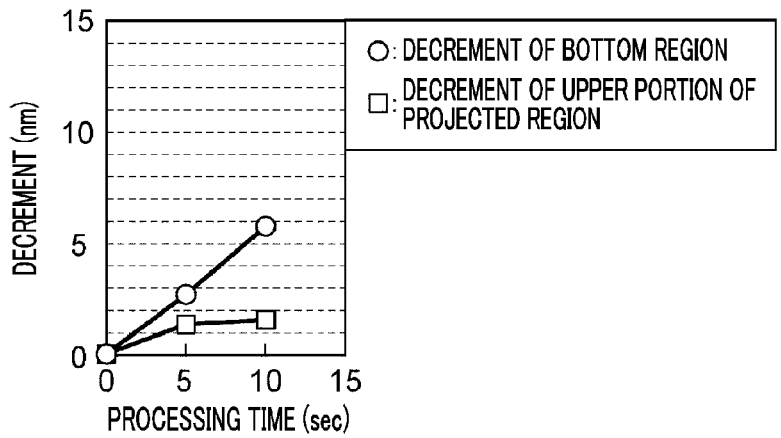
FIG. 11C is a graph showing a result of the experiment conducted upon a fifth sample, a sixth sample and the seventh sample.

Process ST2 (performed on only the first sample to the sixth sample)
  First high frequency power: 60 MHz, 300 W
  Second high frequency power: 40 MHz, 50 W
  Pressure within the internal space 12s: 20 mTorr (2.66 Pa)
  Repetition number of the sequence in the process ST3: 20 times
  Conditions for the process ST31
  First processing gas
  $C_4F_6$ gas of 3.4 sccm
  $O_2$ gas of 3.2 sccm
  Ar gas of 400 sccm
  First high frequency power: 60 MHz, 50 W
  Second high frequency power: 40 MHz, 50 W
  Pressure within the internal space 12s: 10 mTorr (1.33 Pa)
  Processing time in the process ST31 of each sequence: 4 sec
  Process ST32
  Rare gas: Ar gas of 400 sccm
  First high frequency power: 60 MHz, 50 W
  Second high frequency power: 40 MHz, 200 W
  Pressure within the internal space 12s: 10 mTorr (1.33 Pa)
  Processing time in the process ST32 of each sequence: 3 sec In the experiment, for each of the seven samples, a decrement (nm) of the upper portion of the projected region PR and a decrement (nm) of the bottom region BR are measured. The decrement of the upper portion of the projected region PR is an amount by which the upper portion of the projected region PR is etched from the top surface thereof in a thickness direction in the experiment. The decrement (nm) of the bottom region BR is an amount by which the bottom region BR is etched from the top surface thereof in a thickness direction in the experiment. The results are shown in FIG. 11A to FIG. 11C. FIG. 11A shows results of the experiment conducted on the first sample, the second sample and the seventh sample; FIG. 11B, results of the experiment conducted on the third sample, the fourth sample and the seventh sample; FIG. 11C, results of the experiment conducted on the fifth sample, the sixth sample and the seventh sample. On each of the graphs of FIG. 11A, FIG. 11B and FIG. 11C, a horizontal axis indicates the processing time (sec) of the process ST2 and a vertical axis represents the decrement (nm). As can be seen from FIG. 11A, FIG. 11B and FIG. 11C, by using the second processing gas containing the hydrogen gas in the process ST2, the decrement of the bottom region BR can be made larger than the decrement of the projected region PR, that is, the other region belonging to the second region R2. Accordingly, it is found out that the bottom region BR can be selectively etched with respect to the other regions belonging to the second region R2 by using the second processing gas containing the hydrogen gas in the process ST2. Further, in comparison of FIG. 11A, FIG. 11B and FIG. 11C, it is found out that the high etching selectivity for the bottom region BR is obtained by using the mixed gas of the hydrogen gas and the nitrogen gas as the second processing gas.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. An etching method of etching a processing target object,
   wherein the processing target object comprises an underlying region, a first region and a second region,
   the second region is made of silicon nitride and comprises: a first projected region and a second projected region extended from the underlying region to provide a recess therebetween; and a bottom region extended on a bottom of the recess, and
   the first region is made of silicon oxide and configured to cover the second region,
   wherein the etching method comprises:
   etching the first region;
   forming a modified region by selectively modifying the bottom region after the first region is etched; and
   etching the modified region,
   wherein the etching of the first region comprises:
   generating plasma of a first processing gas containing a fluorocarbon gas to form a deposit of fluorocarbon on the first region; and
   generating first plasma of a rare gas to etch the first region by supplying ions of atoms of the rare gas toward the processing target object on which the deposit is formed,
   wherein, in the etching of the first region, the deposit is formed on an exposed portion of the second region and the second region is protected by the deposit,
   a thickness of the deposit formed on a top surface of the first projected region and a top surface of the second projected region is larger than a thickness of the deposit formed on the bottom region,
   wherein, in the forming of the modified region, plasma of a second processing gas containing hydrogen is generated, and ions of the hydrogen from the plasma of the second processing gas are supplied to the processing target object in which the first region is etched,
   wherein the etching of the modified region comprises:
   generating plasma of a third processing gas containing a fluorocarbon gas to form a deposit of fluorocarbon on the processing target object having the modified region; and
   generating second plasma of a rare gas to etch the modified region by supplying ions of atoms of the rare gas toward the processing target object which has the modified region and on which the deposit is formed.

2. The etching method of claim 1,
   wherein the second processing gas further contains a nitrogen gas.

3. The etching method of claim 1,
   wherein the forming of the modified region and the etching of the modified region are repeated alternately.

4. The etching method of claim 1,
   wherein, in the generating of the plasma of the first processing gas, a temperature of the processing target object is set to be in a range from 20° C. to 250° C. inclusive.

5. The etching method of claim 1,
   wherein the second processing gas further contains a rare gas.

6. The etching method of claim 1,
   wherein, in the generating of the plasma of the third processing gas, a temperature of the processing target object is set to be in a range from 20° C. to 250° C. inclusive.

7. The etching method of claim 1,
wherein the etching of the first region, the forming of the modified region and the etching of the modified region are performed in a plasma processing apparatus, and
wherein the plasma processing apparatus comprises:
a chamber main body configured to provide an internal space therein;
a supporting table, including a lower electrode, provided within the internal space and configured to provide a placing region on which the processing target object is placed, a center of the placing region being positioned on a central axis of the chamber main body;
a first high frequency power supply configured to generate a first high frequency power for plasma generation;
a second high frequency power supply electrically connected to the lower electrode and configured to generate a second high frequency power having a frequency lower than a frequency of the first high frequency power; and
an electromagnet configured to generate a magnetic field within the internal space,
wherein at least when the plasma of the second processing gas is being generated, the electromagnet forms within the internal space a distribution of a magnetic field in which a horizontal component at an edge side of the processing target object is larger than a horizontal component on a center of the processing target object in which the first region is etched.

8. The etching method of claim 7,
wherein a power level of the second high frequency power supplied in the generating of the plasma of the third processing gas is lower than a power level of the second high frequency power supplied in the generating of the second plasma of the rare gas.

9. The etching method of claim 7,
wherein, in the generating of the plasma of the third processing gas, the second high frequency power is not supplied.

10. The etching method of claim 7,
wherein the electromagnet includes a yoke and a coil.

11. The etching method of claim 10,
wherein the coil includes multiple coils, and the multiple coils are coaxially arranged with respect to the horizontal component on the center of the processing target object.

12. The etching method of claim 10,
wherein the yoke is made of magnetic material, and has a base portion and multiple cylindrical portions.

13. The etching method of claim 12,
wherein the base portion has a substantially disk shape and is extended in a direction perpendicular to the horizontal component on the center of the processing target object.

14. The etching method of claim 12,
wherein the multiple cylindrical portions are coaxially arranged with respect to the horizontal component on the center of the processing target object.

* * * * *